(12) United States Patent
Joo

(10) Patent No.: US 6,180,541 B1
(45) Date of Patent: Jan. 30, 2001

(54) METAL-ORGANIC (MO) CHEMICAL VAPOR DEPOSITION METHOD AND MO CHEMICAL VAPOR DEPOSITION REACTOR

(75) Inventor: Jae-Hyun Joo, Choongcheongbuk-Do (KR)

(73) Assignee: Hyundai Electronics Industries Co., Ltd., Kyoungki-Do (KR)

( * ) Notice: Under 35 U.S.C. 154(b), the term of this patent shall be extended for 0 days.

(21) Appl. No.: 09/189,800

(22) Filed: Nov. 12, 1998

(30) Foreign Application Priority Data

Apr. 8, 1998 (KR) .................................................. 12338-98

(51) Int. Cl.[7] .................................................. H01L 21/469

(52) U.S. Cl. .................................... 438/785; 438/3; 438/5

(58) Field of Search .................................. 438/3, 5, 240, 438/396, 510, 167, 507, 706, 785, 786

(56) References Cited

U.S. PATENT DOCUMENTS

| | | | |
|---|---|---|---|
| 4,839,145 | 6/1989 | Gale et al. | 422/245 |
| 5,227,340 | * 7/1993 | Pintchovski et al. | 438/5 |
| 5,431,958 | 7/1995 | Desu et al. | . |
| 5,536,323 | 7/1996 | Kirlin et al. | 118/726 |
| 5,629,229 | * 5/1997 | Si et al. | 438/3 |
| 5,652,431 | * 7/1997 | DeSisto et al. | 438/785 |

* cited by examiner

*Primary Examiner*—David Nelms
*Assistant Examiner*—Dung A Le
(74) *Attorney, Agent, or Firm*—Morgan, Lewis & Bockius LLP

(57) ABSTRACT

A method for forming a thin film on a surface of a semiconductor device includes vaporizing a metal-organic source, preheating a carrier gas, carrying the vaporized metal-organic source to a reaction unit using the preheated carrier gas, and reacting the metal-organic source with a reactant gas to form the thin film on the surface of the semiconductor device in the reaction unit by a chemical vapor deposition process.

10 Claims, 5 Drawing Sheets

METAL-ORGANIC (MO) CHEMICAL VAPOR DEPOSITION METHOD AND MO CHEMICAL VAPOR DEPOSITION REACTOR

This application claims the benefit of Korean patent application No. 12338/1998, filed Apr. 8, 1998, which is hereby incorporated by reference.

BACKGROUND OF THE INVENTION

1. Field of the Invention

The present invention relates to a semiconductor manufacturing process, and more particularly, to an MOCVD (metal-organic chemical vapor deposition) method and a metal-organic chemical vapor deposition reactor for forming a semiconductor film by flowing a carrier gas and a reactant gas heated to a predetermined temperature into the MOCVD reactor.

2. Discussion of the Related Art

Generally, various methods are used to form a layer (thin film) in a semiconductor manufacturing process. Particularly, a CVD process is widely used, since a thin film obtained by the CVD process has excellent step coverage, fast deposition rate and uniform thickness.

In the CVD process, a thin film (or an epi-layer) is formed on a semiconductor substrate from a gaseous compound. The formation of the thin film is mainly accomplished by flowing a gas to a reaction chamber without consuming a material of a silicon wafer. An effective CVD reaction occurs within a certain temperature range, and in order to assist the reaction, a gas plasma created by RF or optical energy, such as laser or ultraviolet rays, is used. Thus, the reaction of atoms or molecules, which are resolved by heating the substrate, may be accelerated, and physical characteristics of the thin film may be controlled for a more effective CVD reaction.

The CVD process typically grows a thin film by using a gaseous source. However, when depositing ferroelectric materials, such as Ta, PZT (lead zirconium titanium oxide) or BST (Ba, Sr)$TiO_3$, and wiring materials such as Al or Cu, it is difficult to form a gaseous source with these materials. Thus, the CVD process deposits a thin film using a solid or liquid source of a metal-organic type. Such a process is called an MOCVD process.

FIG. 1 illustrates equipment used in the MOCVD process. The MOCVD equipment 1 includes a source supply unit 2, a vaporization unit 3 and a reaction unit 4. The vaporization unit 3 is described in more detail in FIGS. 2A and 2B, where FIG. 2A illustrates a structure of the vaporization unit 3, and FIG. 2B illustrates part 'A' of FIG. 2A in greater detail.

As shown in FIG. 2B, when a non-gaseous source is introduced into the vaporization unit 3, the source is converted to a gas, and the gaseous source and a flowed carrier gas are mixed with each other while passing through a metal frit 5. The metal frit 5, which is heated to a predetermined temperature, vaporizes the liquid. The vaporized liquid produced by the frit 5 flows into the reaction unit 4 after being carried by the carrier gas and mixed therewith.

The reaction unit 4 includes a heater 41 for heating the substrate to a higher temperature than a deposition temperature, a quartz cover 42 and a shower head 43. In the MOCVD equipment 1, the shower head 43 uses a type of a metal plate having a number of holes for uniformly depositing ejected gas.

The source used in the MOCVD process exists in either a solid or a liquid condition. However, it is preferable to use the liquid source to control the amount of gas which flows into the vaporization unit 3 or to control the composition ratio of the source. Thus, a solid source is typically dissolved in a solvent.

In the MOCVD process, the source is in a liquid or solid state as described above, and the vaporization unit 3 is used to convert the source into a gas for the CVD process.

The source from the source supply unit 2 flows into the vaporization unit 3, as shown in FIG. 2A, which maintains a temperature higher than the vaporization temperature of the source but lower than the deposition or reaction temperature. Due to flash evaporation, the introduced liquid source becomes a gas in the vaporization unit 3 at high temperature. The gaseous source is carried into the reaction unit 4 by the carrier gas, and then the gaseous source reacts with the reactant gas in the reaction unit 4, and the thin film is deposited on the substrate.

However, the temperature of the reaction unit 4 before the gaseous source reaches the substrate should be high enough so that the gaseous source does not condense or react before reaching the substrate. Therefore, the temperature of the shower head 43 of the conventional reaction unit 4, through which the gaseous source passes, is maintained at a uniform temperature using various methods. Although the shower head 43 functions to eject the gaseous source for uniform deposition, this function may be affected by radiation from elements such as the heater 41 in the reaction chamber 4. Accordingly, the reaction chamber 4 should be kept at a uniform temperature. If a proper change in temperature and uniform ejection of the gas are not maintained, the formation and uniformity of the thin film are adversely affected. Accordingly, the uniformity and deposition rate of the thin film depend considerably on the temperature of the shower head 43 as well as the material making up the shower head 43.

However, it is difficult to manufacture and control the shower head 43 to maintain the uniform temperature. Furthermore, the deposition rate of the thin film at low temperatures is low, and the thin film formed at a low temperature may not have uniform thickness, affecting the performance of the semiconductor device.

SUMMARY OF THE INVENTION

Accordingly, the present invention is directed to an improved MOCVD equipment and an MOCVD method that substantially obviates the problems due to limitations and disadvantages of the related art.

An object of the present invention is to provide an MOCVD equipment and an MOCVD method that deposits a thin film with less dependence on a temperature of a shower head in the MOCVD equipment.

Another object of the present invention is to provide an MOCVD equipment and an MOCVD method that improves the step coverage of the thin film by lowering a deposition temperature.

Another object of the present invention is to provide an MOCVD equipment and an MOCVD method that improves the deposition rate of the thin film and obtains a uniform thickness of the thin film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a method for forming a thin film on a semiconductor substrate including the steps of vaporizing a metal-organic source, preheating a carrier gas, carrying the vaporized metal-organic source to a reaction unit using the carrier gas, and reacting the metal-organic source with a reactant gas to form the thin film on the semiconductor substrate in the reaction unit by a chemical vapor deposition process.

In another aspect of the present invention there is provided a method for forming a thin film for a capacitor for a dynamic random access memory DRAM including the steps of vaporizing a metal-organic source, preheating a carrier gas, carrying the vaporized metal-organic source to a chemical vapor deposition reactor using the carrier gas, and reacting the metal-organic source with a reactant gas in the chemical vapor deposition reactor to form the thin film on a semiconductor substrate in the chemical vapor deposition reactor.

In another aspect of the present invention there is provided a metal-organic chemical vapor deposition reactor including a vaporization unit for vaporizing a metal-organic source, a reaction unit for forming a semiconductor film, and first preheating means connected to the vaporization unit for preheating a carrier gas to a first temperature, wherein the first temperature is higher than a vaporization temperature of the metal-organic source and lower than a deposition temperature for forming the semiconductor film.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate an embodiment of the invention and together with the description serve to explain the principles of the invention.

DETAILED DESCRIPTION OF THE PREFERRED EMBODIMENTS

Reference will now be made in detail to the preferred embodiment of the present invention, examples of which are illustrated in the accompanying drawings.

The present invention provides a method for forming a thin film at a low temperature using an MOCVD equipment. Lowering of deposition temperature improves step coverage, and an increase of the deposition rate improves production efficiency. Further, the present invention reduces dependency of the fabrication process on a temperature of a shower head of the MOCVD equipment.

Such advantages can be achieved by preheating a carrier gas flowed into a vaporization unit and a reactant gas into a reaction unit to a higher temperature than a vaporization temperature of a source gas but lower than a reaction temperature of the source gas.

A liquid or solid source and the carrier gas are introduced into the vaporization unit, and the vaporization unit may partially cool the source due to the presence of the carrier gas, as in the conventional art. However, the present invention prevents the cooling of the source by preheating the carrier gas. The carrier gas is preheated to increase a vaporization efficiency and to activate the gas flowing out of the vaporization unit, lowering a deposition temperature and increasing a deposition rate.

Figure 1:
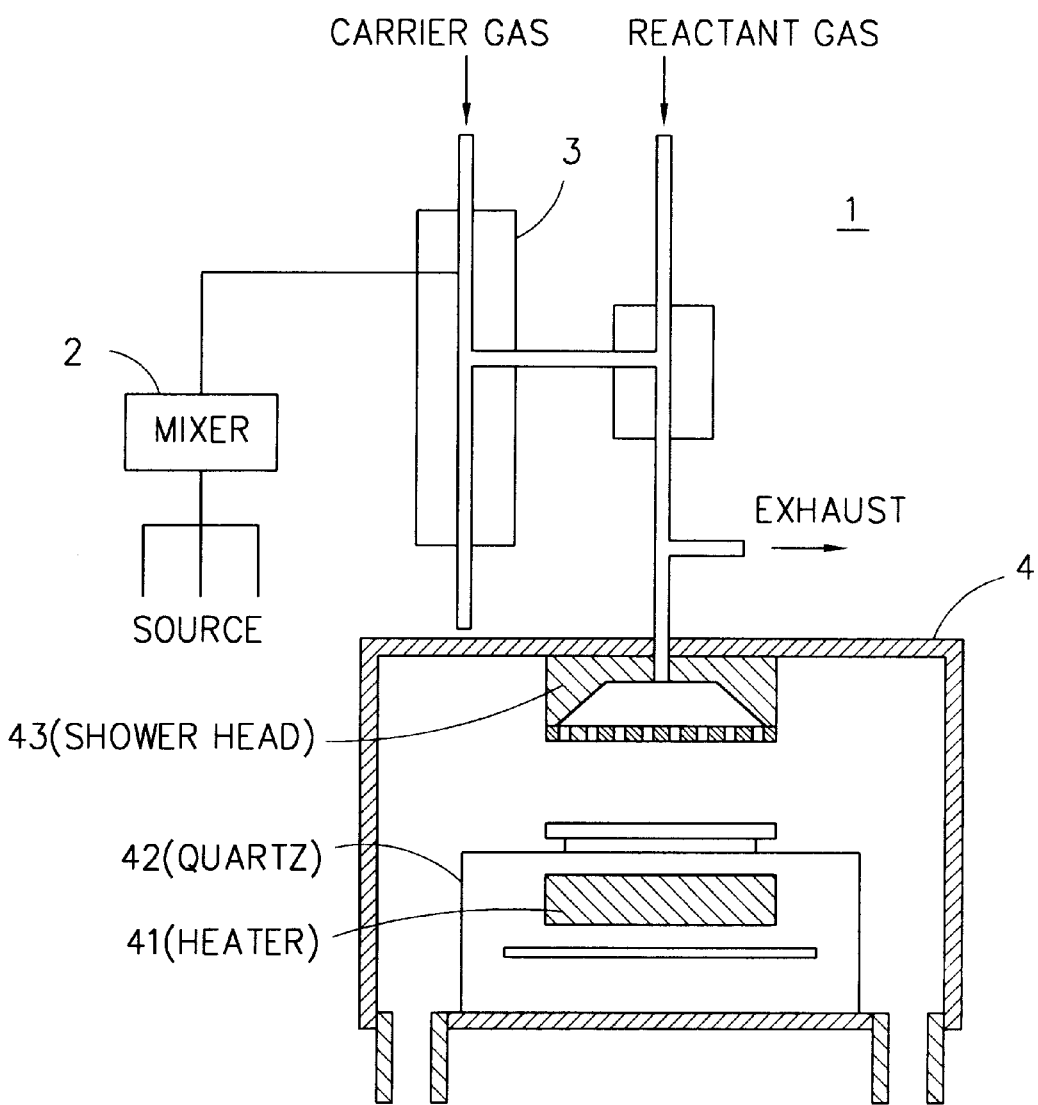
FIG. 1 is a schematic diagram illustrating a structure of a conventional metal-organic chemical vapor deposition reactor.
Figure 2A:
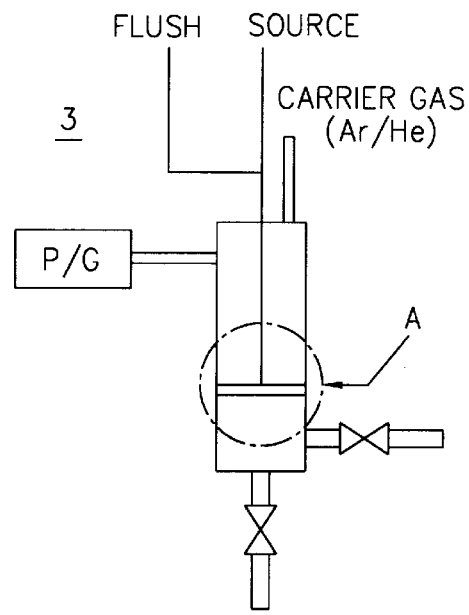
FIG. 2A is a schematic diagram illustrating a vaporization unit shown in FIG. 1.
Figure 2B:
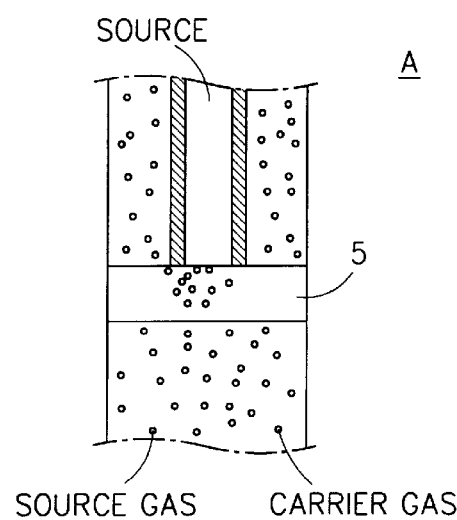
FIG. 2B is an enlarged diagram illustrating part 'A' of FIG. 2A in detail.
Figure 3:
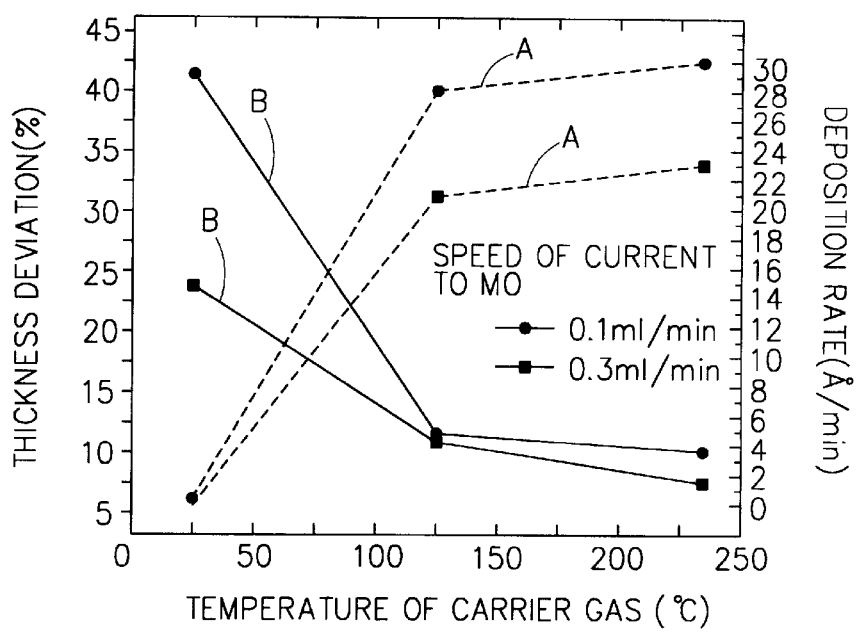
FIG. 3 is a graph illustrating deposition rate and thickness deviation as a function of a temperature of carrier gas according to the present invention.

FIG. 3 illustrates deposition rate and thickness deviation with temperature of the carrier gas according to the present invention. The source MO flows at 0.1 ml/min and 0.3 ml/min, respectively. The horizontal axis indicates a temperature of the carrier gas, the right vertical axis indicates the deposition rate (Å/min) (dotted lines A), whereas the left horizontal axis indicates thickness deviation (%) (solid lines B).

When a thin film is formed where the carrier gas flows into the vaporization unit without the preheating process, the deposition rate of the thin film is quite slow, and the thickness deviation thereof drastically depends on a flow rate of the MO source.

However, when the thin film is formed by flowing the preheated carrier gas whose temperature is between the vaporization temperature and the deposition temperature, the deposition rate is much improved, as shown in the dotted lines A. The improvement of the deposition rate increases manufacturing throughput. In addition, as shown by the solid lines B, the thickness deviation due to a different flow rate of the MO source is considerably decreased. As the flow rate of the MO source is increased, these effects of preheating the carrier gas become greater.

Thus, FIG. 3 shows that it is much more effective to flow the preheated carrier gas into the vaporization unit.

Figure 4:
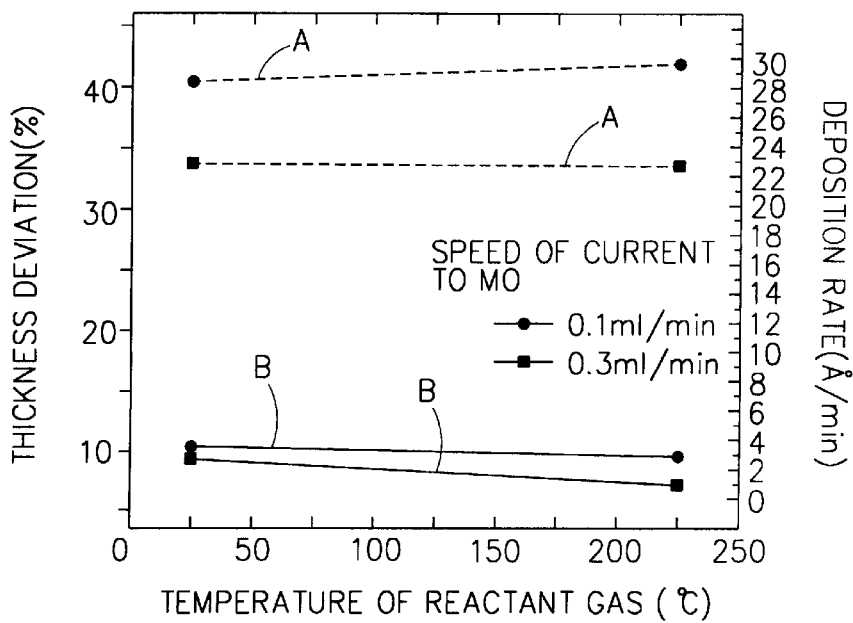
FIG. 4 is a graph illustrating deposition rate and thickness deviation as a function of a temperature of a reactant gas according to the present invention.

FIG. 4 illustrates a case where a thin film is formed by flowing a preheated reactant gas into the reaction unit. Similar to FIG. 3, FIG. 4 illustrates deposition rate and thickness deviation of a thin film with temperature of the reactant gas. The MO source flows at 0.1 ml/min and 0.3 ml/min, respectively. The horizontal axis indicates a temperature of the reactant gas, the right vertical axis indicates deposition rate (Å/min) (dotted lines A), whereas the left horizontal axis indicates thickness deviation (%) (solid lines B).

In FIG. 4, although an oxidation gas is used as the reactant gas, other reactant gases may also be used. As shown in FIG. 4, when a thin film is formed by flowing the reactant gas into the reaction unit without preheating, the deposition rate of the thin film is slow, and the thickness deviation thereof has a difference in accordance with the flow rate of each MO source.

However, when the thin film is formed by flowing the preheated reactant gas in a temperature range between the vaporization temperature and the deposition temperature, the deposition rate improves, as shown by the dotted lines A. The improvement of the deposition rate increases manufacturing throughput. In addition, as shown by the solid lines B, the thickness deviation does not significantly depend on the different flow rates of the MO source. As the flow rate of the MO source is increased, these effects of preheating the reactant gas becomes greater.

Thus, FIG. 4 shows that it is much more effective to flow the preheated reactant gas into the reaction unit.

As described above, the object of the present invention may be achieved by flowing the carrier gas and the reactant gas into the vaporization unit and the reaction unit, respectively, after preheating both.

The shower head ejects the gas to be uniformly deposited, and is generally located in the MOCVD equipment. As mentioned before, control of the temperature of the shower head is one of the important factors in forming the thin film. Since it is difficult to maintain the temperature of the shower head uniform, the operation of manufactured semiconductor devices is affected. Thus, it is desirable to decrease the dependency on the MOCVD equipment. Accordingly, the MOCVD equipment of the invention decreases the dependency of the thin film formation on the MOCVD equipment, as will be described with reference to FIGS. 5A and 5B.

Figure 5A:
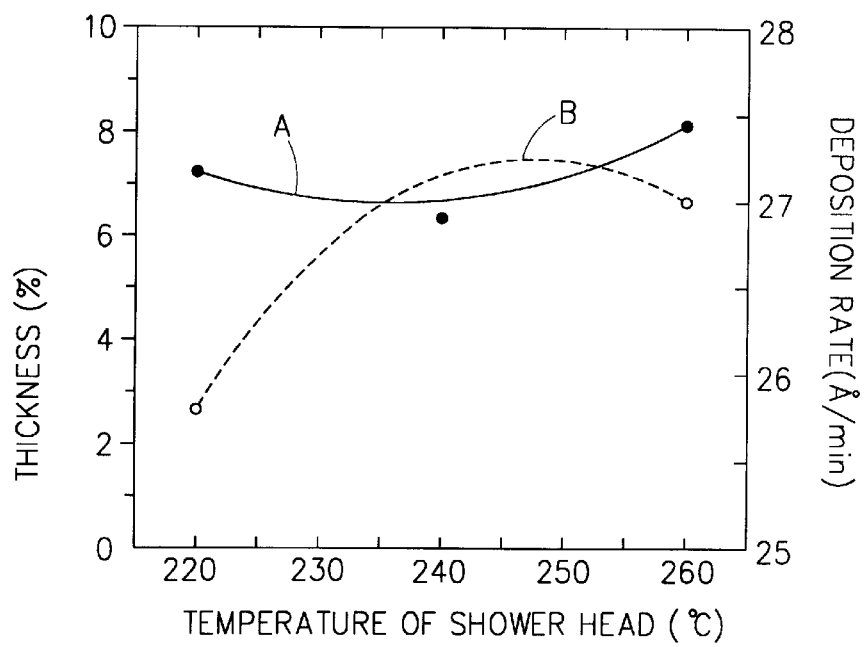
FIG. 5A is a graph illustrating deposition rate and thickness deviation as a function of a temperature of a shower head of a MOCVD equipment according to the present invention.

FIG. 5A illustrates deposition rate and thickness deviation of a thin film as a function of the temperature of the shower head in the MOCVD equipment when the carrier gas and the reactant gas are heated to an adequate temperature according to the present invention. In FIG. 5A, the horizontal axis indicates a temperature range of the shower head and the left vertical axis shows the thickness deviation of the thin film (solid line A), whereas the right vertical axis shows the deposition rate thereof (dotted line B). The results of the above graph are obtained for the case where the carrier gas and the reactant gas are preheated.

As shown therein, although the temperature of the shower head is in the range between 220 and 260° C., or even outside that range, the thickness deviation of the thin film has a comparatively uniform range, and its deposition rate is improved as the temperature of the shower head is increased. Here, the temperature of the substrate is maintained at 440° C. The graph indicates that the deposition rate of the thin film depends on the temperature of the shower head, whereas the thickness of the thin film does not depend significantly on the temperature of the shower head.

Accordingly, the present invention offers improved deposition rate and uniform thickness of the thin film without depending on the temperature of the shower head.

Figure 6:
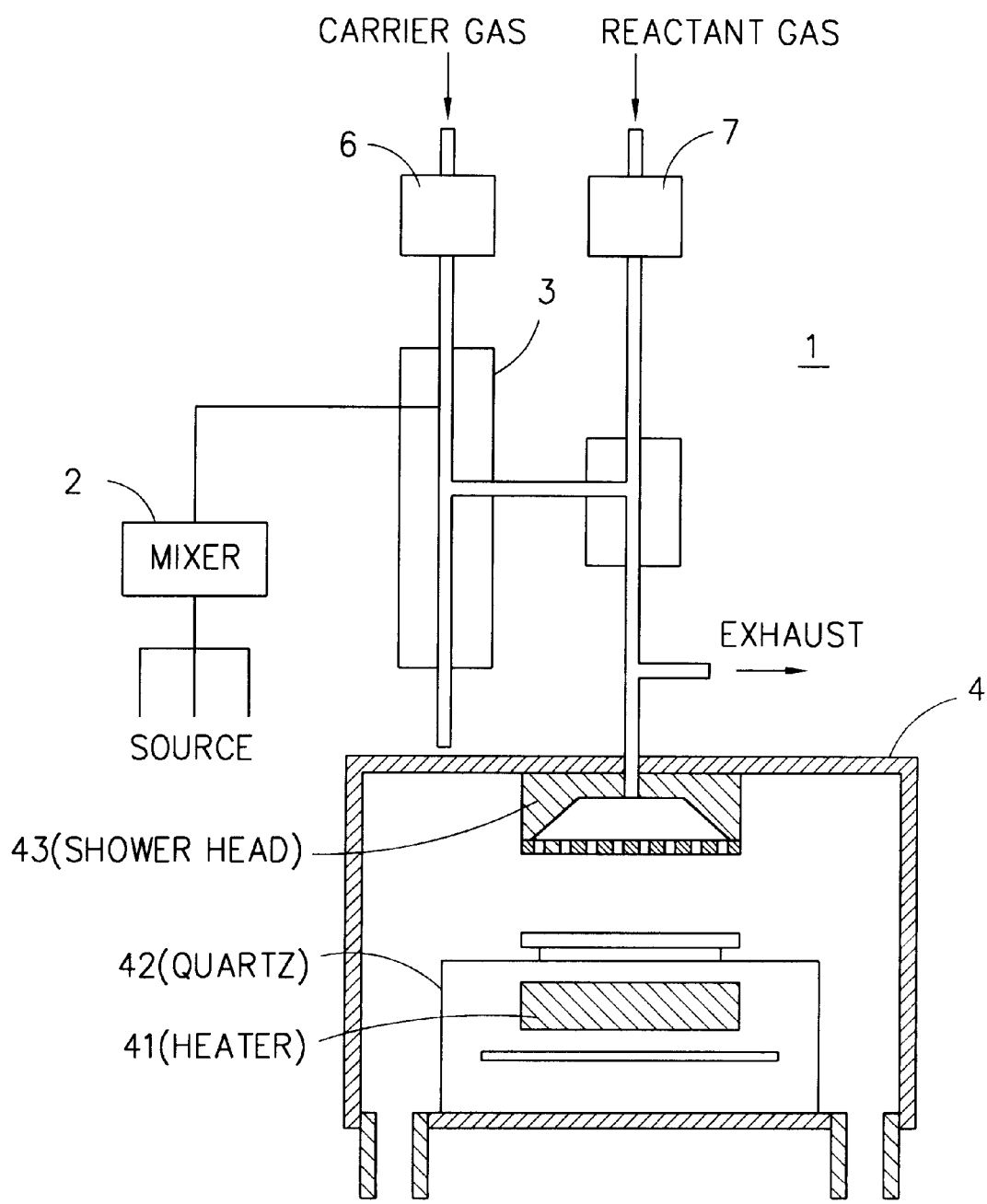
FIG. 6 is a schematic diagram illustrating a structure of an MOCVD reactor according to the present invention.

Further, heaters for heating the reactant gas and the carrier gas may be added to the MOCVD equipment of the present invention, as shown in FIG. 6. The elements which are the same as those of the conventional art are labeled with the same reference numbers. First and second preheating units 6 and 7, respectively, preheat the carrier gas and the reactant gas, respectively. Thus, the MOCVD equipment of the present invention obtains the advantages as described above.

With the MOCVD equipment shown in FIG. 6, a thin film used in the fabrication of a capacitor for a dynamic random access memory (DRAM) is formed by the MOCVD process using $(Ba, Sr)TiO_3$.

In the MOCVD process, butylacetate including $Ba(DPM)_2$, $Sr(DPM)_2$ and $Ti(i—Pr—O)(DPM)_2$ may be used as a liquid BST source. Here, DPM refers to Dipivaloylmethane, although Tetramethylheptanedione (THD) can be substituted.

The BST liquid source flows into the vaporization unit 3 and is vaporized, and the vaporized gaseous source is carried into the reaction unit 4 by the carrier gas, such as Ar, which has been preheated in the first preheating unit 6. Here, the mixed gas in the reaction unit 4 reacts with the reactant gas, such as $O_2$, which has been preheated in the second preheating unit 7, thereby forming a BST thin film on a substrate which is heated above a predetermined deposition temperature.

In the above process, the reaction gas and the carrier gas are preheated to a temperature in the range between the vaporization temperature and the deposition temperature. Here, the preferable range of the preheat temperature is between 200 and 350° C.

Figure 5B:
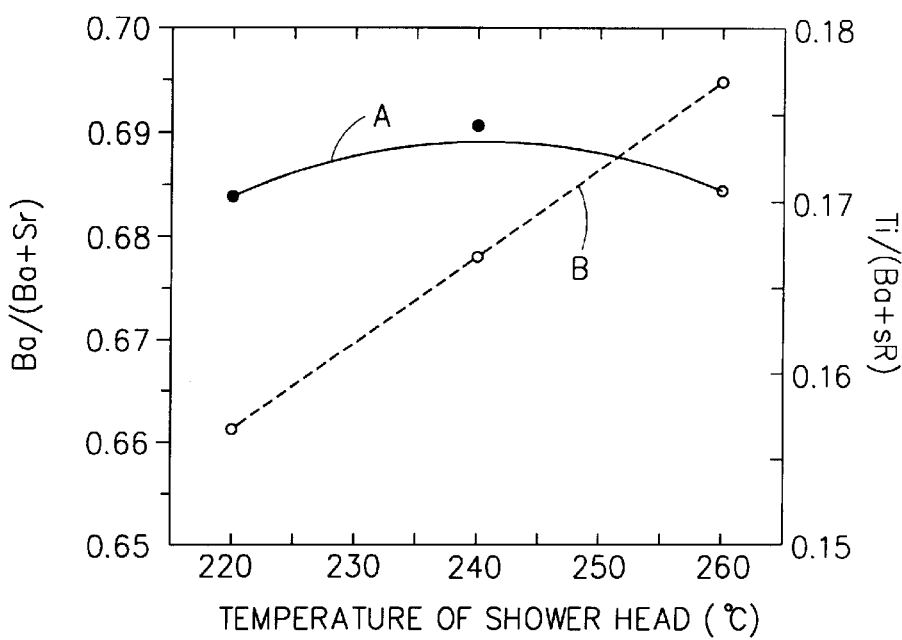
FIG. 5B is a graph illustrating composition ratio of each source as a function of a temperature of a shower head of a MOCVD equipment according to the present invention.

FIG. 5B illustrates composition ratio of each source with temperature of the shower head of the MOCVD equipment according to the present invention. In the graph, the left vertical axis indicates the ratio of Ba to Ba+Sr, which is used as the MO source, as a function of the temperature of the shower head (solid line A), and the right vertical axis indicates the ratio of Ti to Ba+Sr (dotted line B). The results shows that MOCVD of the invention produces a uniform thin film layer even though the temperature of the shower head is changed, and thus it is not necessary to keep the temperature of the shower head uniform.

Further, as another preferred embodiment, in the MOCVD process using $Ba(DPM)_2$, $Sr(DPM)_2$, $Ti(i—Pr—O)_2(DPM)_2$, $Ti(DPM)_2$, $Ti(DPM)_4$, or $TiO(DPM)_2$ as Ba, Sr, or Ti MO source in DPM, the reactant gas and the carrier gas are heated at 200 to 350° C. and flowed into the vaporization unit and the reaction unit, respectively.

In addition, Ta, Cu, Al, $(Ba, Sr)TiO_3$, or $Pb(Zr, Ti)O_3$ can also be used as the MO source.

According to the present invention, in the MOCVD equipment, the reactant gas and the carrier gas are preheated before flowing into the reaction unit 4 and the vaporization unit 3, respectively, for forming the thin film having uniform thickness and for improving the deposition rate of the thin film. In addition, by adjusting the temperature of the shower head, better deposition results may be obtained.

While the invention has been described in detail and with reference to specific embodiments thereof, it will be apparent to those skilled in the art that various modifications and variations can be made in the MOCVD method and the MOCVD reactor of the present invention without departing from the spirit or scope of the invention. Thus, it is intended that the present invention cover the modifications and variations of this invention provided they come within the scope of the appended claims and their equivalents.

What is claimed is:

1. A method for forming a thin film on a surface of a semiconductor device comprising the steps of:
   vaporizing a metal-organic source;
   preheating a carrier gas;
   carrying the vaporized metal-organic source to a reaction unit using the preheated carrier gas; and
   reacting the metal-organic source with a reactant gas to form the thin film on the surface of the semiconductor device in the reaction unit by a chemical vapor deposition process.

2. The method of claim 1, further including the step of preheating the reactant gas before introducing the reactant gas into the reaction unit.

3. The method of claim 1, wherein the step of preheating the carrier gas includes raising a temperature of the carrier gas to between a vaporization temperature of the metal-organic source and a deposition temperature of the thin film.

4. The method of claim 1, wherein the step of carrying the vaporized metal-organic source to the reaction unit uses a gas distribution unit for evenly distributing the vaporized metal-organic source.

5. The method of claim 1, wherein the step of vaporizing a metal-organic source includes vaporizing a source selected from a group consisting of Ta, Cu, Al, (Ba, Sr)TiO$_3$, and Pb(Zr, Ti)O$_3$.

6. A method for forming a thin film for a capacitor for a dynamic random access memory DRAM comprising the steps of:

vaporizing a metal-organic source;

preheating a carrier gas;

carrying the vaporized metal-organic source to a chemical vapor deposition reactor using the preheated carrier gas; and reacting the metal-organic source with a reactant gas in the chemical vapor deposition reactor to form the thin film on a surface of a semiconductor device in the chemical vapor deposition reactor.

7. The method of claim 6, further including the step of preheating the reactant gas before introducing the reactant gas into the chemical vapor deposition reactor.

8. The method of claim 6, wherein the step of preheating the carrier gas includes raising a temperature of the carrier gas to between a vaporization temperature of the metal-organic source and a deposition temperature of the thin film.

9. The method of claim 8, wherein the step of carrying the vaporized metal-organic source to the reaction unit uses a gas distribution unit for evenly distributing the vaporized metal-organic source.

10. The method of claim 8, wherein the step of vaporizing a metal-organic source utilizes a source including one of Ba, Sr and Ti in a DPM system, the source being selected from a group consisting of Ba(DPM)$_2$, Sr(DPM)$_2$, Ti(i—Pr—O)$_2$, (DPM)$_2$, Ti(DPM)$_2$, Ti(DPM)$_4$, and TiO(DPM)$_2$, and wherein temperatures of the carrier and reactant gases are between 200 and 350° C.

* * * * *